United States Patent [19]

Malladi et al.

[11] Patent Number: 5,784,011
[45] Date of Patent: Jul. 21, 1998

[54] MULTIPLIER CIRCUIT FOR PERFORMING INVERSE QUANTIZATION ARITHMETIC

[75] Inventors: Srinivasa R. Malladi, Santa Clara; Venkat Mattela, Sunnyvale, both of Calif.

[73] Assignee: LSI Logic Corporation, Milpitas, Calif.

[21] Appl. No.: 664,134

[22] Filed: Jun. 14, 1996

[51] Int. Cl.$^6$ .................................................. H03M 7/00
[52] U.S. Cl. .......................... 341/67; 364/759; 348/212; 341/200
[58] Field of Search ........................... 341/67, 65, 50, 341/200; 364/759, 760

[56] References Cited

U.S. PATENT DOCUMENTS

| | | | |
|---|---|---|---|
| 4,065,666 | 12/1977 | Wu | 364/759 |
| 4,849,922 | 7/1989 | Riolfo | 364/725 |
| 4,893,268 | 1/1990 | Denman, Jr. et al. | 364/759 |
| 4,970,676 | 11/1990 | Fling | 364/759 |
| 4,994,997 | 2/1991 | Martin et al. | 364/759 |
| 5,253,195 | 10/1993 | Broker et al. | 364/759 |
| 5,287,299 | 2/1994 | Lin | 364/759 |
| 5,379,076 | 1/1995 | Song | 348/699 |
| 5,477,543 | 12/1995 | Purcell | 370/112 |

*Primary Examiner*—Jeffrey A. Gaffin
*Assistant Examiner*—Peguy Jeanpierre
*Attorney, Agent, or Firm*—Conley, Rose & Tayon, P.C.; B. Noel Kivlin

[57] ABSTRACT

An inverse quantizer includes a multiplier circuit using two adder/subtracter stages to perform a multiplication operation between the quantizer scale value and the weight value. The inverse quantizer may be employed within a video decoder circuit such an an MPEG decoder. The multiplier circuit includes a control unit which receives the seven bit quantizer scale value. The control unit is configured to control a set of multiplexers which select either the weight value and/or bit shifted versions of the weight value to be operated upon by the two stage adder. Accordingly, each multiplexer circuit includes certain bit-shifted versions of the weight value as inputs. The control unit controls the multiplexer circuits such that appropriate inputs are channeled through the multiplexer circuits for operation by a pair of adder/subtracter circuits. The control unit further controls each adder/subtracter circuit such that appropriate arithmatic operations are performed upon the input values in accordance with the particular quantizer scale value. A given quantizer scale value causes the control unit to control the multiplexer circuits as well as the adder/subtracter circuits in a manner such that the desired result is obtained. Since for any given quantizer scale value, no more than a total of three values representing versions of the weight must be arithmatically operated upon, only two adder/subtracter circuits are required to achieve the results of a multiplication between the weight value and the quantizer scale value.

20 Claims, 6 Drawing Sheets

FIG. 5

| Quantiser Scale (250) | Binary Bit Representation (252) | Binary Bit Representation (254) | Number of 1s (256) | Operation (258) |
|---|---|---|---|---|
| 1  | 0000 0001 | 0000 0001 | 1 | (shift by 0) |
| 2  | 0000 0010 | 0000 0010 | 1 | (shift by 1) |
| 3  | 0000 0011 | 0000 0011 | 2 | (shift by 1) + (shift by 0) |
| 4  | 0000 0100 | 0000 0100 | 1 | (shift by 2) |
| 5  | 0000 0101 | 0000 0101 | 2 | (shift by 2) + (shift by 0) |
| 6  | 0000 0110 | 0000 0110 | 2 | (shift by 2) + (shift by 1) |
| 7  | 0000 0111 | 0000 0111 | 3 | (shift by 2) + (shift by 1) + (shift by 0) |
| 8  | 0000 1000 | 0000 1000 | 1 | (shift by 3) |
| 10 | 0000 1010 | 0000 1010 | 2 | (shift by 3) + (shift by 1) |
| 12 | 0000 1100 | 0000 1100 | 2 | (shift by 3) + (shift by 2) |
| 14 | 0000 1110 | 0000 1110 | 3 | (shift by 3) + (shift by 2) + (shift by 1) |
| 16 | 0001 0000 | 0001 0000 | 1 | (shift by 4) |
| 18 | 0001 0010 | 0001 0010 | 2 | (shift by 4) + (shift by 1) |
| 20 | 0001 0100 | 0001 0100 | 2 | (shift by 4) + (shift by 2) |
| 22 | 0001 0110 | 0001 0110 | 3 | (shift by 4) + (shift by 2) + (shift by 1) |
| 24 | 0001 1000 | 0001 1000 | 2 | (shift by 4) + (shift by 3) |
| 26 | 0001 1010 | 0001 1010 | 3 | (shift by 4) + (shift by 3) + (shift by 1) |
| 28 | 0001 1100 | 0001 1100 | 3 | (shift by 4) + (shift by 3) + (shift by 2) |
| 30 | 0001 1110 | 0010 0000 (32-2) | 3 | (shift by 5) - (shift by 1) |
| 32 | 0010 0000 | 0010 0000 | 1 | (shift by 5) |
| 34 | 0010 0010 | 0010 0010 | 2 | (shift by 5) + (shift by 1) |
| 36 | 0010 0100 | 0010 0100 | 2 | (shift by 5) + (shift by 2) |
| 38 | 0010 0110 | 0010 0110 | 3 | (shift by 5) + (shift by 2) + (shift by 1) |
| 40 | 0010 1000 | 0010 1000 | 2 | (shift by 5) + (shift by 3) |
| 42 | 0010 1010 | 0010 1010 | 3 | (shift by 5) + (shift by 3) + (shift by 1) |
| 44 | 0010 1100 | 0010 1100 | 3 | (shift by 5) + (shift by 3) + (shift by 2) |

| Quantiser Scale | Binary Bit Representation | Binary Bit Representation | | Number of 1s | | Operation |
|---|---|---|---|---|---|---|
| 46 | 010 1110 | 100 0000 | 64-18 | 1 | → | (shift by 6) - (shift by 4) - (shift by 1) |
| | | 001 0010 | | 2 | | |
| 48 | 011 0000 | 011 0000 | | 2 | → | (shift by 5) + (shift by 4) |
| 50 | 011 0010 | 011 0010 | | 2 | | (shift by 5) + (shift by 4) + (shift by 1) |
| 52 | 011 0100 | 011 0100 | | 3 | | (shift by 5) + (shift by 4) + (shift by 2) |
| 54 | 011 0110 | 100 0000 | 64-10 | 1 | → | (shift by 6) - (shift by 3) - (shift by 1) |
| | | 000 1010 | | 2 | | |
| 56 | 011 1000 | 100 0000 | 64-8 | 1 | | (shift by 6) - (shift by 3) |
| | | 000 1000 | | 1 | | |
| 58 | 011 1010 | 100 0000 | 64-6 | 1 | → | (shift by 6) - (shift by 2) - (shift by 1) |
| | | 000 0110 | | 2 | | |
| 60 | 011 1100 | 100 0000 | 64-4 | 1 | → | (shift by 6) - (shift by 2) |
| | | 000 0100 | | 1 | | |
| 62 | 011 1110 | 100 0000 | 64-2 | 1 | → | (shift by 6) - (shift by 1) |
| | | 000 0010 | | 1 | | |
| 64 | 100 0000 | 100 0000 | | 1 | → | (shift by 6) |
| 72 | 100 1000 | 100 1000 | | 2 | → | (shift by 6) + (shift by 3) |
| 80 | 101 0000 | 101 0000 | | 2 | → | (shift by 6) + (shift by 4) |
| 88 | 101 1000 | 101 1000 | | 3 | → | (shift by 6) + (shift by 4) + (shift by 3) |
| 96 | 110 0000 | 110 0000 | | 3 | | (shift by 6) + (shift by 5) |
| 104 | 110 1000 | 110 1000 | | 3 | | (shift by 6) + (shift by 5) + (shift by 3) |
| 112 | 111 0000 | 111 0000 | | 3 | → | (shift by 6) + (shift by 5) + (shift by 4) |

FIG. 5A

MULTIPLIER CIRCUIT FOR PERFORMING INVERSE QUANTIZATION ARITHMETIC

BACKGROUND OF THE INVENTION

1. Field of the Invention

The present invention relates generally to digital video compression and decompression, and more particularly to multiplier circuits for performing inverse quantization arithmetic within compressed video systems.

2. Description of the Relevant Art

A variety of compression techniques are known for compressing video information. One popular video compression standard is referred to as MPEG (Moving Pictures Experts Group) compression. MPEG compression is based on two types of redundancies in video sequences, these being spatial, which is the redundancy in an individual frame, and temporal, which is the redundancy between consecutive frames. Spatial compression is achieved by considering the frequency characteristics of a picture frame. Each frame is divided into non-overlapping blocks, and each block is transformed via the discrete cosine transform (DCT). After the transformed blocks are converted to the "DCT domain", each entry in the transformed block is quantized with respect to a set of quantization tables. The quantization step for each entry can vary, taking into account the sensitivity of the human visual system (HVS)} to the frequency. Since the HVS is more sensitive to low frequencies, most of the high frequency entries are quantized to zero. In this step where the entries are quantized, information is lost and errors are introduced to the reconstructed image. Run length encoding is used to transmit the quantized values. To further enhance compression, the blocks are scanned in a zig-zag ordering that scans the lower frequency entries first, and the nonzero quantized values, along with the zero run lengths, are entropy encoded.

When an MPEG decoder receives an encoded stream, the MPEG decoder reverses the above operations. Thus the MPEG decoder performs inverse scanning to remove the zig zag ordering, inverse quantization to de-quantize the data, and the inverse DCT to convert the data from the frequency domain back to the pixel domain. The MPEG decoder also performs motion compensation using the transmitted motion vectors to re-create the temporally compressed frames.

Quantization is a process of reducing the number of bits needed to store an integer value by reducing the precision of the integer. Once a DCT image has been compressed, the precision of the coefficients can generally be reduced more and more the farther they are from the DC coefficient at the origin. That is, the farther a particular coefficient within the DCT matrix is from 0,0, the less that element contributes to the graphical image, and therefore the less important that coefficient becomes.

Inverse quantization is performed by multiplying the quantizer scale value (typically a seven bit unsigned value) and the weight (typically a eight bit unsigned value). A general purpose conventional multiplier is often used to achieve this multiplication. Unfortunately, a conventional multiplier with an eight bit multiplicand and a seven bit multiplier results in seven adder stages corresponding to each bit position of the multiplier. Accordingly, the amount of logic required to implement the conventional multiplier within the inverse quantizer requires a relatively high number of gates and die area.

Another mechanism which is conventionally utilized to perform the multiplication within an inverse quantizer is a booth coded multiplier. A booth coded multiplier operates upon multiple bits at a time. Similar to a conventional multiplier, a booth coded multiplier requires a relatively large number of gates and die area to implement.

Therefore, a new system and method is desired for efficiently performing multiplications within an inverse quantizer. It is further desired to reduce the number of gates and die area required for implementing multiplication between the quantizer scale and the weight value associated with inverse quantization arithmatic.

SUMMARY OF THE INVENTION

The problems outlined above are in large part solved by an inverse quantizer including a multiplication circuit for multiplying a quantizer scale value with a weight value in accordance with the present invention. In one embodiment, an inverse quantizer includes a multiplier circuit using two adder/subtracter stages to perform a multiplication operation between the quantizer scale value and the weight value. The inverse quantizer may be employed within a video decoder circuit such an an MPEG decoder. The multiplier circuit includes a control unit which receives the seven bit quantizer scale value. The control unit is configured to control a set of multiplexers which select either the weight value and/or bit shifted versions of the weight value to be operated upon by the two stage adder/subtracter. Accordingly, each multiplexer circuit includes certain bit-shifted versions of the weight value as inputs. The control unit controls the multiplexer circuits such that appropriate inputs are channeled through the multiplexer circuits for operation by a pair of adder/subtracter circuits. The control unit further controls each adder/subtracter circuit such that appropriate arithmatic operations are performed upon the input values in accordance with the particular quantizer scale value. A given quantizer scale value causes the control unit to control the multiplexer circuits as well as the adder/subtracter circuits in a manner such that the desired result is obtained. Since for any given quantizer scale values no more than a total of three values representing versions of the weight must be arithmatically operated upon, only two adder/subtracter circuits are required to achieve the results of a multiplication between the weight value and the quantizer scale value. Accordingly, the number of gates required to implement the improved multiplier circuit within the inverse quantizer is advantageously reduced. Likewise, the required die area for implementing the multiplier circuit may be reduced.

BRIEF DESCRIPTION OF THE DRAWINGS

Other objects and advantages of the invention will become apparent upon reading the following detailed description and upon reference to the accompanying drawings in which:

FIG. 5 is a table illustrating quantizer scale values with optimized bit patterns.

Figure 1:
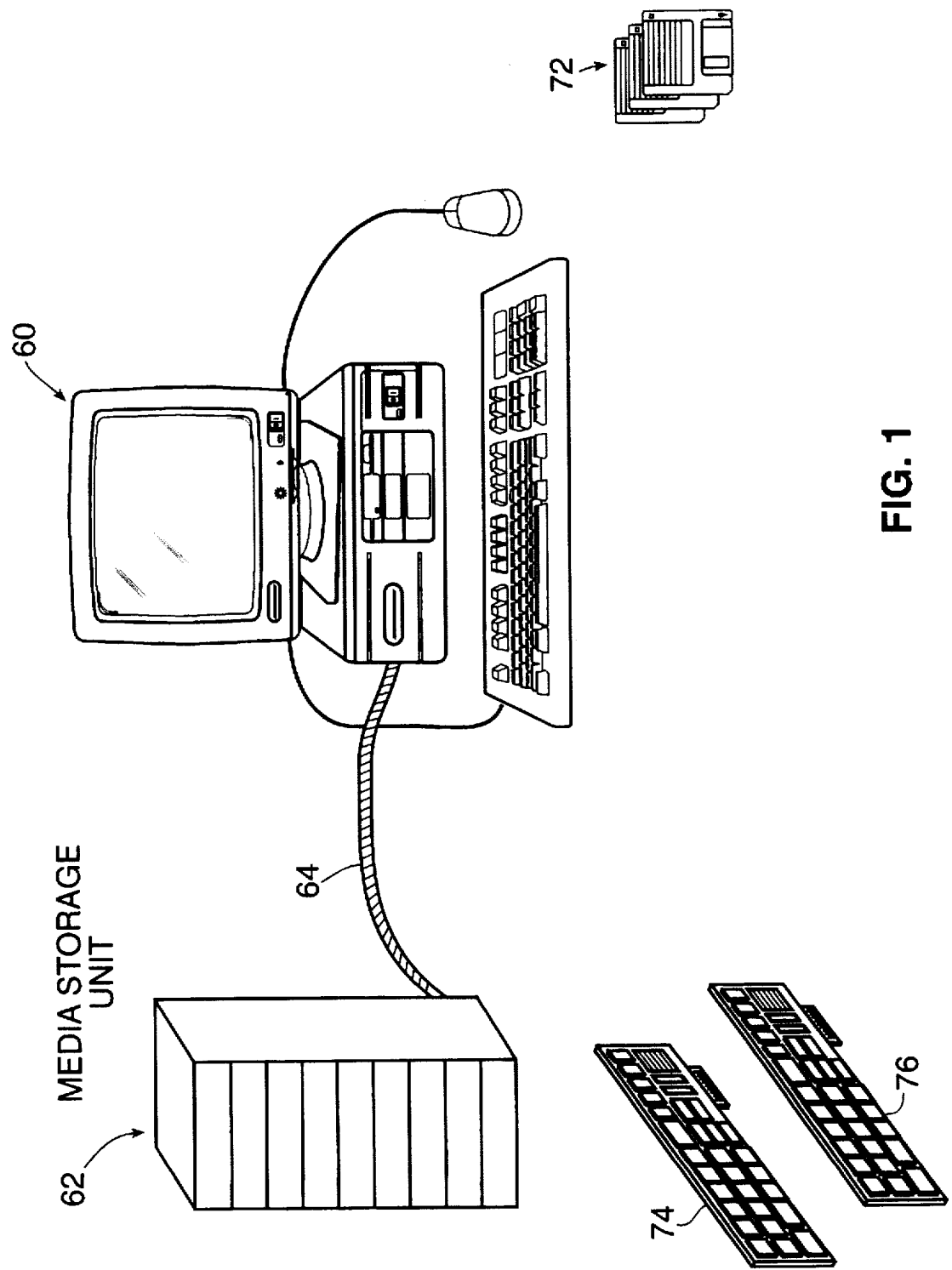
FIG. 1 illustrates a computer system which performs video decoding and which includes a multiplier circuit for performing inverse quantization operations in accordance with the present invention.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION

Video Compression System

Referring now to FIG. 1, a system for performing video decoding or decompression is shown. As will be described further below, an inverse quantizer within the decoding system employs an improved multiplier circuit in accordance with the invention. In one embodiment the video decoding or decompression system comprises a general purpose computer system 60. The video decoding system may comprise any of various types of systems, including a computer system, set-top box, television, or other device.

The computer system 60 is preferably coupled to a media storage unit 62 which stores digital video files which are to be decompressed or decoded by the computer system 60. The media storage unit 62 may also store the resultant decoded or decompressed video file. In one embodiment, the computer system 60 receives a compressed video file or bitstream and generates a normal uncompressed digital video file. In the present disclosure, the term "compressed video file" refers to a video file which has been compressed according to any of various video compression algorithms which use motion estimation techniques, including the MPEG standard, among others, and the term "uncompressed digital video file" refers to a stream of decoded or uncompressed video.

As shown, the computer system 60 preferably includes a video decoder 74 which performs video decoding or decompression operations. The video decoder 74 is preferably an MPEG decoder. The computer system 60 optionally may also include an MPEG encoder 76. The MPEG decoder 74 and MPEG encoder 76 are preferably adapter cards coupled to a bus in the computer system, but are shown external to the computer system 60 for illustrative purposes. The computer system 60 also includes software, represented by floppy disks 72, which may perform portions of the video decompression or decoding operation and/or may perform other operations, as desired.

Figure 2:
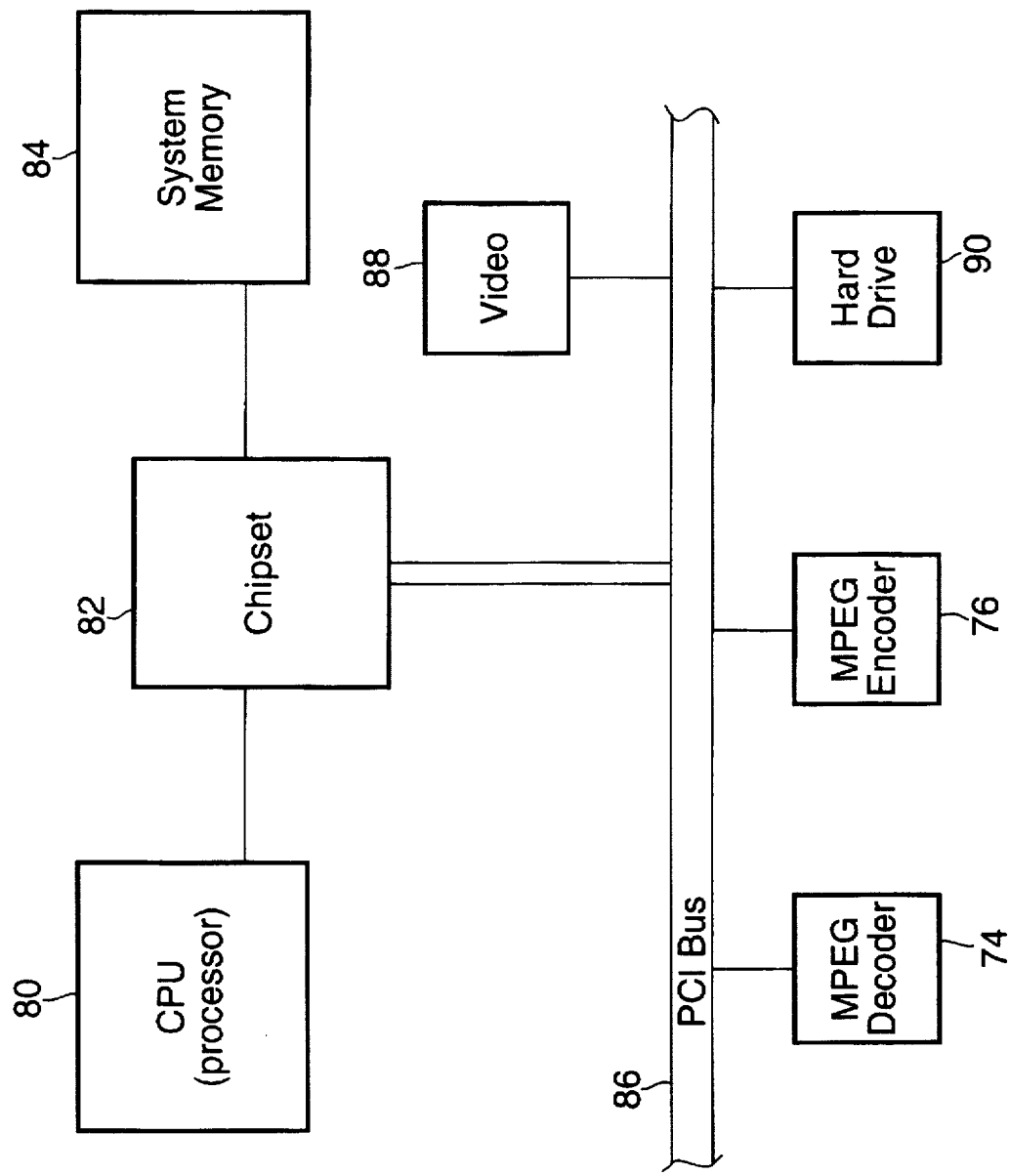
FIG. 2 is a block diagram illustrating the computer system of FIG. 1.

The computer system 60 preferably includes various standard components, including one or more processors, one or more buses, a hard drive and memory. Referring now to FIG. 2, a block diagram illustrating the components comprised in the computer system of FIG. 1 is shown. It is noted that FIG. 2 is illustrative only, and other computer architectures may be used, as desired. As shown, the computer system includes at least one processor 80 coupled through chipset logic 82 to a system memory 84. The chipset 82 preferably includes a PCI (Peripheral Component Interconnect) bridge for interfacing to PCI bus 86, or another type of bus bridge for interfacing to another type of expansion bus. In FIG. 2, MPEG decoder 74 and MPEG encoder 76 are shown connected to PCI bus 86. Various other components may be comprised in the computer system, such as video 88 and hard drive 90.

As mentioned above, in the preferred embodiment of FIG. 1 the computer system 60 includes or is coupled to one or more digital storage or media storage devices. For example, in the embodiment of FIG. 1, the computer system 60 couples to media storage unit 62 through cable 64. The media storage unit 62 preferably comprises a RAID (Redundent Array of Inexpensive Disks) disk array, or includes one or more CD-ROM drives and/or one or more Digital Video Disk (DVD) storage units, or other media, for storing digital video to be decompressed and/or for storing the resultant decoded video data. The computer system may also include one or more internal RAID arrays, CD-ROM drives and/or may couple to one or more separate Digital Video Disk (DVD) storage units. The computer system 60 also may connect to other types of digital or analog storage devices or media, as desired.

Alternatively, the compressed digital video file may be received from an external source, such as a remote storage device or remote computer system. In this embodiment, the computer system preferably includes an input device, such as an ATM (Asynchronous Transfer Mode) adapter card or an ISDN (Integrated Services Digital Network) terminal adapter, or other digital data receiver, for receiving the digital video file. The digital video file may also be stored or received in analog format and converted to digital data, either externally to the computer system 60 or within the computer system 60.

It is noted that the system for decoding or decompressing video data may comprise two or more interconnected computers, as desired. The system for decoding or decompressing video data may also comprise other hardware, such as a set top box, either alone or used in conjunction with a general purpose programmable computer.

Figure 3:
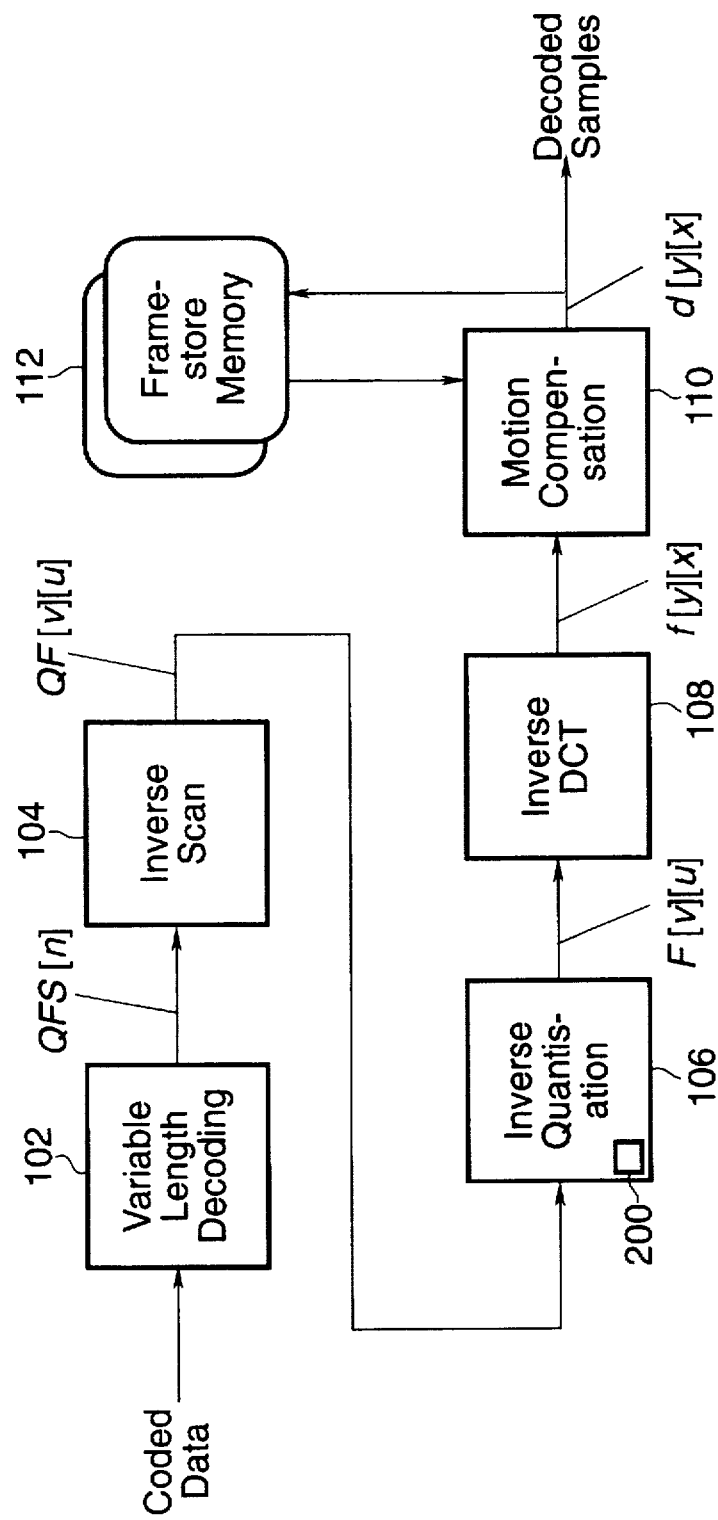
FIG. 3 is a block diagram illustrating an MPEG decoder including an inverse quantizer in accordance with the present invention.

FIG. 3—MPEG Decoder Block Diagram

Referring now to FIG. 3, a block diagram illustrating an MPEG decoder 74 which includes an improved multiplier circuit 200 for performing inverse quantization operations in accordance with the invention shown. As shown, the video decoder 74 receives an encoded or compressed digital video stream and outputs an uncompressed digital video stream. The compressed digital video stream is a bitstream of compressed video data which is used to present a video sequence, such as a television segment or movie, onto a screen, such as a television or a computer system. In one embodiment, the compressed digital video stream is compressed using the MPEG-2 compression algorithm, and the video decoder 74 is thus an MPEG-2 decoder. Since the operation of MPEG decoders is well known in the art, details of their operation which are not necessary to the operation of the present invention are omitted for simplicity.

As shown in FIG. 3, the MPEG decoder 74 comprises a Variable Length Decoding block 102 coupled to provide an output to an Inverse Scan block 104, which is coupled to provide an output to an Inverse Quantization block 106. Inverse Quantization block 106 is coupled to provide an output to an Inverse DCT block 108, which is coupled to provide an output to a motion compensation block 110. The motion compensation block 110 provides an output comprising decoded samples. A frame store memory 112 is coupled to the output of the motion compensation block 110 to receive and store decoded frame data. The motion compensation block 110 is coupled to an output of the frame store memory 112 to receive reference block data from the frame store memory 112 during motion compensation.

As shown in FIG. 3, the Variable Length Decoding S block 102 receives coded data and performs variable length decoding. As is well known, the MPEG standard provides that data is compressed for transmission using variable length codes. Thus the Variable Length Decoding block 102 decodes this data and produces an output, referred to as QFS[n]. The QFS[n] output of the Variable Length Decoding block 102 is provided to the Inverse Scan block 104. The Inverse Scan block 104 reverses the zig zag scan ordering of the received data (is this right) and produces an output referred to as QF[v] [u]. The output QF[v] [u] is provided to the Inverse Quantization block 106. The Inverse Quantization block 106 performs inverse quantization or de-quantizes the data to produce de-quantized data, referred to as F[v] [u]. The output F[v] [u] of the Inverse Quantization block 106 is provided to the Inverse DCT block 108, which performs the inverse discrete cosine transform to convert the data from the frequency domain back to the pixel domain. The inverse DCT block 108 produces an output referred to as f[y] [x]. The output f[y] [x] of the inverse DCT block 108 is provided to the motion compensation block 110.

The output f[y] [x] from the inverse. DCT block 108 comprises temporally encoded frames of pixel data. The motion compensation block 110 decompresses the temporally compressed frames using motion compensation techniques. As described above, an MPEG encoded stream comprises I, P and B frames. P and B frames are temporally compressed relative to other frames. P frames are temporally compressed relative to prior I or P frames, and B frames are temporally compressed relative to prior or subsequent I or P frames. When a frame is temporally compressed, the frame is partitioned into macroblocks, referred to as target blocks, and then the compression method searches in neighboring frames for blocks which are most similar to the block being encoded. When the best fit block is found, the respective target block is encoded by a motion vector which points to this best fit reference block in the reference frame. The difference between the block being encoded and the best fit block is also computed and transferred in the MPEG stream.

Output pixel values from the motion compensation block 110 are provided to a frame store memory 112. The frame store memory 112 is thus coupled to the motion compensation block 110 and stores one or more reference frames of video data. These reference frames of video data are used in performing motion compensation on temporally compressed frames, such as P and B frames. In general, an MPEG stream includes encoded reference frame data which is transmitted before temporally compressed data that depends on the prior transmitted reference frame data. Thus, incoming temporally encoded frame data, such as P and B frame data, comprises motion vectors which point to reference blocks in a prior transmitted reference frame of video data, which has been stored in the frame store memory 112. The motion compensation block 110 analyzes each motion vector from the incoming temporally compressed data and retrieves a reference block from the frame store memory 112 in response to each motion vector. The motion compensation block 110 includes a local memory or on-chip memory 116 which stores the retrieved reference block. The motion compensation block 110 then uses this retrieved reference block to decompress the temporally compressed data.

Inverse Quantizer Multiplier Circuit

Figure 4:
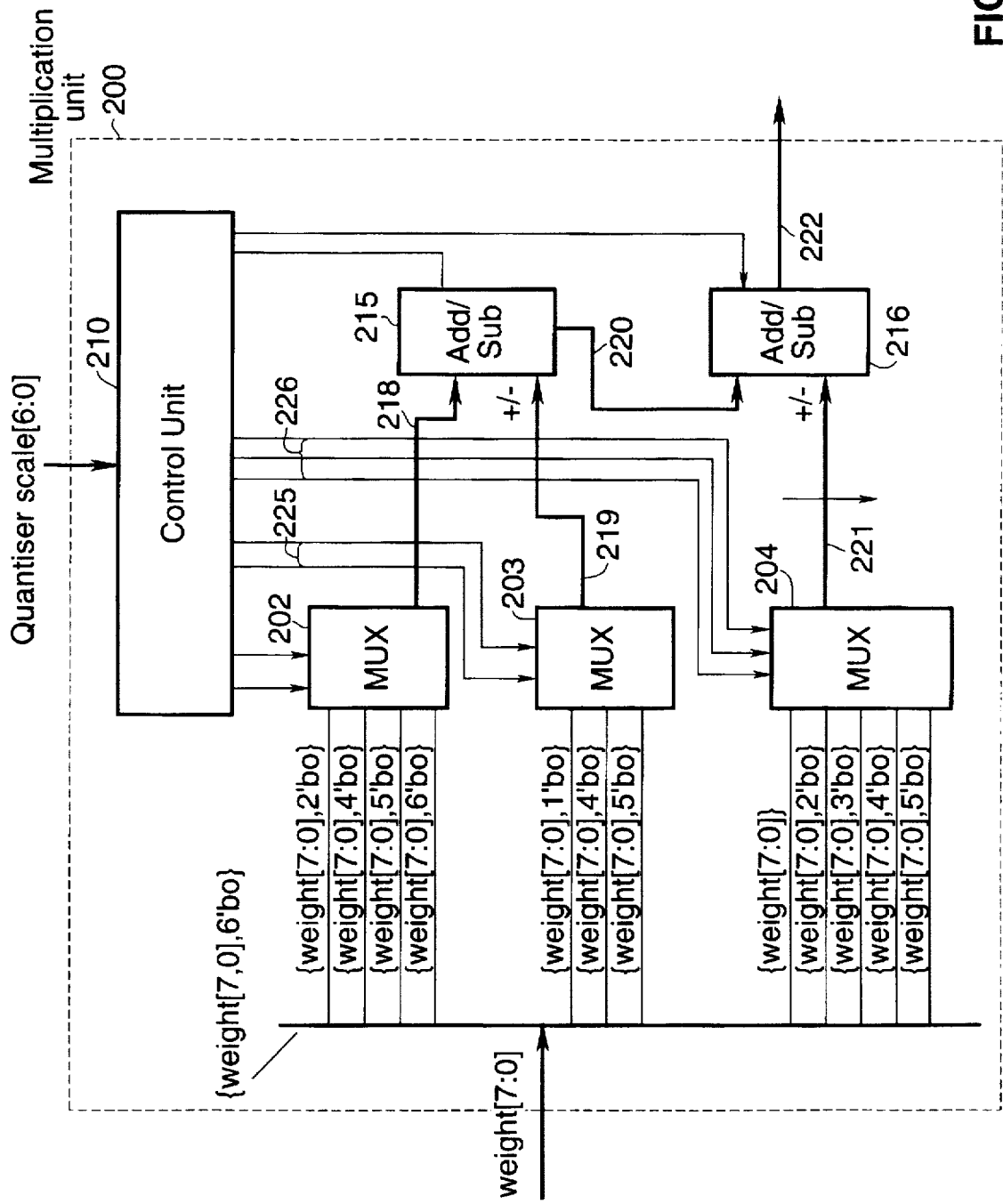
FIG. 4 is a block diagram of a multiplier circuit in accordance with the present invention.

Referring now to FIG. 4, a block diagram of multiplication unit 200 is shown. Multiplication unit 200 is configured to multiply the eight bit weight value weight [7:0] with a seven bit quantizer scale value (quantizer scale[6:0]). Multiplication unit 200 includes multiplexers 202–204 each coupled to receive as inputs certain bit shifted values of the weight [7:0] value. Multiplexer 204 further receives as an input an un-shifted version of the weight [7:0] value. More specifically, multiplexer 202 receives at a first input the weight [7:0]value bit shifted to the left by two bit positions (i.e., weight [7:0], 2'b0). The lower two bits of this input are therefore set to zero. Multiplexer 202 similarly receives versions of the weight [7:0] value which are bit shifted by four bit positions, five bit positions, and six bit positions as respective inputs.

In a similar manner, multiplexer 203 receives versions of the weight [7:0] value which are bit shifted to the left by one bit position, four bit positions, and five bit positions. Finally, multiplexer 204 receives as inputs versions of weight [7:0] value which are bit shifted by two, three, four, and five bit positions.

As it will be described further below, a control unit 210 within multiplication unit 200 is advantageously configured to select appropriate inputs to multiplexers 202–204 to be operated upon by an adder/subtracter circuit 215 and an adder/subtracter circuit 216. Control unit 210 further controls whether each adder/subtracter circuit 215 and 216 performs an add or a subtract operation. An output of adder/subtracter circuit 215 is provided as an input to adder/subtracter circuit 216. An output of adder/subtracter circuit 216 provides a value of the result of the multiplication operation between the weight [7:0] value and the quantizer scale [6:0] value.

FIG. 5 is a table which illustrates quantizer scale values with optimized bit patterns. The optimized bit patterns are deterministic of the manner in which control unit 210 controls the routing of selected values through multiplexer circuits 202–204 and the operations of adder/subtracter circuits 215 and 216. All possible quantizer scale values are enumerated in a column 250 along with binary bit representation values of the quantizer values in column 252. A column 254 illustrates optimized equivalent bit patterns which represent the corresponding values to be operated upon by the adder/subtracter circuits 215 and/or 216. Column 256 illustrates the number of "one"s in each bit pattern. Column 258 describes the values selected by control unit 210, and the required operations by the adder/subtracter circuits.

As illustrated in the table of FIG. 5, the optimized bit representation of the quantizer scale values include no more than three "one"s. This thereby results in the requirement of no more than a total of three versions of the weight [7:0] values (either bit shifted or non-bit shifted) to be operated upon by adder/subtracter circuits 215 and 216 to derive the required result.

Control unit 210 is configured to control the multiplexers 202–204 and adder/subtracter circuits 215 and 216 in a predetermined manner for each quantizer scale value. The resulting operations in response to control unit 210 for each quantizer scale value is illustrated in column 258. For example, for an input quantizer scale value of "1", control unit 210 is configured to provide a control signal to multiplexer 204 such that the value weight [7:0] (un-shifted) is selected and is provided to adder/subtracter circuit 216. Control unit 210 further provides a control signal to adder/subtracter circuit 216 that causes the output of adder/subtracter circuit 215 to be ignored (or interpreted as a volume of zero), thus causing the value weight [7:0] to be output from adder/subtracter circuit 216. This accordingly results in a multiplication operation of the weight [7:0] value by one.

To multiply the weight [7:0] by a quantizer value of "2", control unit 210 provides a control signal to multiplexer 203 to select weight [7:0],1'b0. Control unit 210 further causes adder/subtracter circuit 215 to provide that value to output line 220, and controls adder/subtracter circuit 216 to provide the value to output bus 222 (i.e., adder/subtracter circuits 215 and 216 do not add or subtract anything (or a value of zero) to the value conveyed on bus 219). Similarly, to multiply the weight value by a quantizer scale of "3", control unit 210 controls multiplexer 204 to select weight [7:0] and controls multiplexer 203 to select the weight [7:0],1'b0 value. Control unit 210 further controls adder/subtracter unit 215 such that the value on bus 219 is provided to bus 220. Finally, control unit 210 controls adder/subtracter circuit 216 such that the values on buses 220 and 221 are added. The output of adder/subtracter circuit 216 is thus a value which is three times the weight [7:0] value.

Referring to the entries of FIG. 5 for a quantizer scale of "5", control unit 210 controls multiplexer 202 to select weight [7:0],2'b0, controls multiplexer 203 to select weight [7:0],1'b0, and controls multiplexer 204 to select weight [7:0]. These values, which are conveyed on buses 218, 219, and 221, respectively, are provided to adder/subtracter circuits 215 and 216. Control unit 210 controls adder/subtracter circuit 215 such that the values upon buses 218 and 219 are added. Control unit 210 further controls adder/subtracter circuit 216 such that the values upon buses 220 and 221 are added. The output at bus 222 thus represents a value which is five times the weight [7:0] value. Control unit 210 controls multiplexers 202–204 and adder/subtracter circuits 215 and 216 in a similar manner for other quantizer values as illustrated in FIG.5.

To achieve the multiplication for certain quantizer scale values, control unit 210 causes certain values to be subtracted rather than added. More specifically, for quantizer scale values of "30", "46", "54", "56", "58", "60" and "62", control unit 210 controls multiplexers 202–204 and addition/subtraction units 215 and 216 such that the illustrated operations are effactuated. For example, to multiply the weight [7:0] value by a quantizer scale of "30", control unit 210 causes multiplexer 202 to select weight [7:0],5'b0, and controls multiplexer 203 such that weight [7:0],1'b0is selected. Control unit 210 finally controls adder/subtracter unit 215 such that the value upon bus 219 is subtracted from the value conveyed by bus 218. Control unit 210 further controls adder/subtracter unit 216 such that the intermediary value conveyed upon bus 220 is provided to output bus 222.

Similarly, to multiply the weight [7:0] value by a quantizer scale of "54", control unit 210 controls multiplexer 202 such that weight [7:0],6'b0is selected, controls multiplexer 203 such that weight [7:0],1'b0is selected, and controls multiplexer 204 such that weight [7:0],3'b0is selected. The resulting value thus conveyed on bus 219 is subtracted from the value conveyed on bus 218 to obtain an intermediary value conveyed on bus 220. Control unit 210 further controls adder/subtracter unit 216 such that the value upon bus 221 is subtracted from the intermediary value upon bus 220. The output at bus 222 thus reflects a value which is 54 times the weight [7:0] value.

In accordance with above description, a weight value associated with an inverse quantization operation may be multiplied by any possible quantizer scale value. Only two adder/subtracter circuits are required, and only up to a maximum of three versions of the weight value (either shifted or non-shifted) must be provided to the adder/subtracter circuits. Accordingly, the overall number of gates required to implement the multiplier circuit is less than that required for a conventional multiplier circuit and for a booth coded multiplier circuit. This advantageously allows the multiplier operations to occur faster, and reduces the overall required die area to implement the multiplier circuit.

Numerous variations and modifications will become apparent to those skilled in the art once the above disclosure is fully appreciated. It is intended that the following claims be interpreted to embrace all such variations and modifications.

What is claimed is:

1. A circuit for multiplying a weight value with a quantizer scale value comprising:
   a plurality of multiplexer circuits wherein each of said multiplexer circuits is coupled to receive bit-shifted versions of said weight value;
   a first adder/subtracter circuit having a first input coupled to receive an output of a first of said plurality of multiplexer circuits and a second input coupled to receive an output of a second of said plurality of multiplexer circuits;
   a second adder/subtracter circuit coupled to receive an output of said first adder/subtracter circuit and an output of a third of said plurality of multiplexer circuits, wherein an output of said second adder/subtracter circuit represents said multiplication between said weight value and said quantizer scale value; and
   a control unit coupled to said plurality of multiplexer circuits and to said first and second adder/subtracter circuits.

2. The multiplier circuit as recited in claim 1 wherein said first of said plurality of multiplexer circuits receives a first set of bit shifted versions of said weight value.

3. The multiplier circuit as recited in claim 2 wherein said second of said plurality of multiplexer circuits receives a second set of said bit shifted versions of said weight value.

4. The multiplier circuit as recited in claim 3 wherein said third of said plurality of multiplexer circuits receives a third set of said said bit shifted versions of said weight value.

5. The multiplier circuit as recited in claim 4 wherein said third of said plurality of multiplexer circuits is further configured to receive an un-shifted version of said weight value.

6. The multiplier circuit as recited in claim 1 wherein said control unit receives said quantizer scale value as an input.

7. The multiplier circuit as recited in claim 6 wherein said control unit controls selections of said bit shifted versions of said weight value by said plurality of multiplexer circuits depending upon said quantizer scale value.

8. The multiplier circuit as recited in claim 7 wherein said control unit is further configured to control whether said first adder/subtracter circuit performs an addition or subtraction operation depending upon said quantizer scale value.

9. The multiplier circuit as recited in claim 8 wherein said control unit is further configured to control whether said second adder/subtracter circuit performs an addition or subtraction operation depending upon said quantizer scale value.

10. The multiplier circuit as recited in claim 1 wherein said first adder/subtracter circuit receives bit-shifted versions of said weight value through a first and a second of said plurality of multiplexer circuits.

11. The multiplier circuit as recited in claim 10 wherein said second adder/subtracter circuit is configured to perform either an add or subtract operation upon another bit-shifted version of said weight value received through a third of said plurality of multiplexer circuits with an output of said first adder/subtracter circuit depending upon said quantizer scale value.

12. A compressed video decoder comprising:
   a variable length decoding block for receiving coded data and producing variable length decoded data;
   an inverse scanning block which receives said variable length decoded data and produces inverse scanned data; and
   an inverse quantization block which receives said inverse scanned data and produces de-quantized data, wherein said inverse quantization block includes a multiplier circuit for multiplying a weight value with a quantizer scale value, said multiplier circuit including:

- a plurality of multiplexer circuits wherein each of said multiplexer circuits is coupled to receive bit-shifted versions of said weight value;
- a first adder/subtracter circuit having a first input coupled to receive an output of a first of said plurality of multiplexer circuits and a second input coupled to receive an output of a second of said plurality of multiplexer circuits;
- a second adder/subtracter circuit coupled to receive an output of said first adder/subtracter circuit and an output of a third of said plurality of multiplexer circuits, wherein an output of said second adder/subtracter circuit represents said multiplication between said weight value and said quantizer scale value; and
- a control unit coupled to said plurality of multiplexer circuits and to said first and second adder/subtracter circuits.

13. The decoder as recited in claim 12 wherein said first of said plurality of multiplexer circuits receives a first set of bit shifted versions of said weight value.

14. The decoder as recited in claim 13 wherein said second of said plurality of multiplexer circuits receives a second set of said bit shifted versions of said weight value.

15. The decoder as recited in claim 14 wherein said third of said plurality of multiplexer circuits receives a third set of said said bit shifted versions of said weight value.

16. The decoder as recited in claim 15 wherein said third of said plurality of multiplexer circuits is further configured to receive an un-shifted version of said weight value.

17. The decoder as recited in claim 12 wherein said control unit receives said quantizer scale value as an input.

18. The decoder as recited in claim 17 wherein said control unit controls selections of said bit shifted versions of said weight value by said plurality of multiplexer circuits depending upon said quantizer scale value.

19. The decoder as recited in claim 18 wherein said control unit is further configured to control whether said first adder/subtracter circuit performs an addition or subtraction operation depending upon said quantizer scale value.

20. The decoder as recited in claim 19 wherein said control unit is further configured to control whether said second adder/subtracter circuit performs an addition or subtraction operation depending upon said quantizer scale value.

* * * * *